United States Patent
Lee et al.

(10) Patent No.: US 7,929,033 B2
(45) Date of Patent: Apr. 19, 2011

(54) IMAGE SENSOR PACKAGE AND CAMERA MODULE HAVING SAME

(75) Inventors: Chi-Kuei Lee, Taipei Hsien (TW); Ying-Cheng Wu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 400 days.

(21) Appl. No.: 12/173,002

(22) Filed: Jul. 14, 2008

(65) Prior Publication Data
US 2009/0262226 A1    Oct. 22, 2009

(30) Foreign Application Priority Data
Apr. 18, 2008   (CN) .......................... 2008 1 0301206

(51) Int. Cl.
*H04N 5/335* (2006.01)
*H01L 27/00* (2006.01)

(52) U.S. Cl. ..................................... 348/294; 250/208.1

(58) Field of Classification Search .................. 348/294, 348/340; 250/208.1, 239; 257/700; 438/116
See application file for complete search history.

(56) References Cited

U.S. PATENT DOCUMENTS

| 6,798,053 B2 * | 9/2004 | Chiu ............................. 257/684 |
| 7,498,606 B2 * | 3/2009 | Street et al. ..................... 257/79 |
| 2004/0189854 A1 * | 9/2004 | Tsukamoto et al. ........... 348/340 |
| 2004/0198854 A1 * | 10/2004 | Takahata et al. ................ 521/97 |
| 2004/0251509 A1 * | 12/2004 | Choi ............................. 257/432 |
| 2006/0027740 A1 * | 2/2006 | Glenn et al. .................. 250/239 |
| 2006/0091487 A1 * | 5/2006 | Hanada et al. ................ 257/432 |
| 2006/0219862 A1 | 10/2006 | Ho et al. |
| 2007/0166955 A1 * | 7/2007 | Noma .......................... 438/458 |
| 2007/0292127 A1 * | 12/2007 | Kuhmann et al. ............. 396/529 |

* cited by examiner

*Primary Examiner* — Lin Ye
*Assistant Examiner* — Trung Diep
(74) *Attorney, Agent, or Firm* — Zhigang Ma

(57) ABSTRACT

An image sensor package includes a first substrate, an image sensor chip, a processing chip and a plurality of passive elements. The first substrate has a supporting surface and a bottom surface opposite to the supporting surface. The image sensor chip is disposed on the supporting surface and electrically connected to the first substrate. The image sensor chip package further includes a second substrate. The processing chip and the passive elements are mounted on the second substrate and electrically connected to the second substrate. The bottom surface of the first substrate defines a cavity for receiving the second substrate, the processing chip and the passive elements therein.

17 Claims, 3 Drawing Sheets

IMAGE SENSOR PACKAGE AND CAMERA MODULE HAVING SAME

BACKGROUND

1. Technical Field

The present invention relates to image sensor packages, and particularly, to a miniaturized image sensor package and a camera module having the same.

2. Description of the Related Art

Because of advances in micro-circuitry and multimedia technology, digital cameras are now in widespread use. Portable electronic devices, such as mobile phones and personal digital assistants, are being developed to be increasingly multi-functional. Many of these portable electronic devices are equipped with digital cameras. To facilitate portability, such portable electronic devices tend to be compact, slim, and light. Accordingly, digital cameras incorporated in the portable electronic devices must also be small.

Referring to FIG. 3, a typical image sensor package 100a is shown. The image sensor package 100a includes a substrate 13a, to which an image sensor 11a, a number of passive elements 12a, and a processing chip 14a are electrically connected. This arrangement consumes a lot of space, which is undesirable for the need of miniaturization.

Therefore, what is desired is a camera module that can overcome the above described problem.

SUMMARY

In accordance with an embodiment, an image sensor package and a camera module having the same are disclosed. The image sensor package includes a first substrate, an image sensor chip, a processing chip and a plurality of passive elements. The first substrate has a supporting surface and a bottom surface opposite to the supporting surface. The image sensor chip is disposed on the supporting surface and electrically connected to the first substrate. The image sensor chip package further includes a second substrate. The processing chip and the passive elements are mounted on the second substrate and electrically connected to the second substrate. The bottom surface of the first substrate defines a cavity for receiving the second substrate, the processing chip, and the passive elements therein.

Other advantages and novel features will be drawn from the following detailed description of at least one present embodiment, when considered in conjunction with the attached drawings.

BRIEF DESCRIPTION OF THE DRAWINGS

Many aspects of the present image sensor package and camera module can be better understood with reference to the attached drawings. The components in the drawings are not necessarily drawn to scale, the emphasis instead being placed upon clearly illustrating the principles of the present image sensor package and the camera module. Moreover, in the drawings, like reference numerals designate corresponding parts throughout the several views.

DETAILED DESCRIPTION

Embodiments of the present image sensor package will be now described in detail with reference to the drawings.

Figure 1:
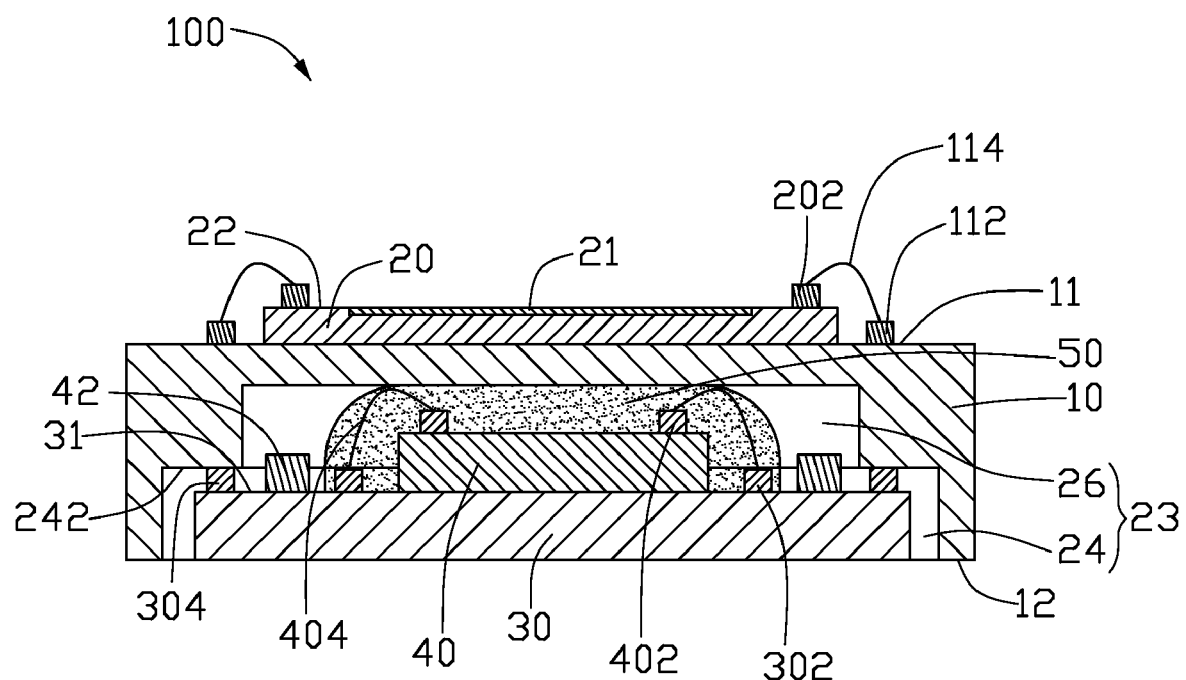
FIG. 1 is a schematic cross-sectional view of an image sensor package, according to an embodiment of the present invention.

Referring to FIG. 1, a image sensor package 100, according to a exemplary embodiment, includes an image sensor chip 20, a first substrate 10, a processing chip 40, a second substrate 30, and a plurality of passive elements 42.

The image sensor chip 20 is a charged coupled device (CCD), or a complementary metal-oxide-semiconductor transistor (CMOS). The image sensor chip 20 is configured to convert light signals into digital electrical signals. The image sensor chip 20 has a photosensitive area 21 and a non-photosensitive area 22 surrounding the photosensitive area 21. The non-photosensitive area 22 has a number of first chip pads 202 formed thereon.

The first substrate 10 is made of a material such as: polyimide, ceramic, or glass fiber. The first substrate 10 defines a supporting surface 11 for engaging with the image sensor chip 20 and a bottom surface 12 opposite to the supporting surface 11. The image sensor chip 20 is mounted on the center of the supporting surface 11.

A number of first base pads 112 are disposed on the supporting surface 11 of the first substrate 10 and surrounds the image sensor chip 20. Each first base pad 112 is electrically connected to a corresponding one of the first chip pads 202, e.g., via a respective first wire 114. The first wires 114 are made of a conductive material, such as gold, silver, aluminum, or an alloy thereof. Alternately, the image sensor chip 20 may be mechanically and electrically connected to the first substrate 10 by a package process, for example, chip-scale, wafer-level chip-scale, ceramic leaded, plastic leadless chip, thermal compression bonding, or a flip chip packaging process.

The bottom surface 12 defines a cavity 23. In the illustrated embodiment, the cavity 23 is ladder-like, and includes a wide portion 24 and a narrow portion 26 communicating with the wide portion 24. A step surface 242 is defined at the bottom of the wide portion 24, with a number of electrical connection points (not shown) thereon.

The processing chip 40 is configured for processing digital electrical signals transmitted from the image sensor 20. The processing chip 40 may be a control chip or a memory card, etc. A number of second chip pads 402 are disposed on the processing chip 40.

The passive elements 42 are electrically connected to the second substrate 30 and surrounding the processing chip 40. The passive elements 42 are components configured for improving the transmission quality of the image sensor 20. The passive elements 42 may be inducers, capacitors, and/or resistors.

The second substrate 30 is also made of a material such as: polyimide, ceramic, or glass fiber. The second substrate 30 defines a top surface 31 for supporting the processing chip 40 and the plurality of passive elements 42.

A number of second base pads 302 are disposed on the top surface 31 of the second substrate 30. Each second base pad 302 is electrically connected to a corresponding one of the second chip pads 402, e.g., via a respective second wire 404. The second wires 404 are made of a conductive material, such as gold, silver, aluminum, or an alloy thereof. Alternately, the processing chip 40 may be mechanically and electrically connected to the second substrate 30 by a packaging process, for example, chip-scale, wafer-level, ceramic leaded, plastic leadless chip, thermal compression bonding, or a flip chip packaging process.

Advantageously, the image sensor chip package 100 further includes a encapsulation epoxy 50 for covering the processing chip 40, the second chip pads 404, the second base pads 302, and the second wires 404.

A number of soldering points 304 are disposed on the edge of the top surface 31 of the second substrate 30. The soldering points 304 can be one of ball grid array (BGA), leadless chip carrier (LCC) and lead frame package type. The soldering points 304 are mechanically and electrically connected to the electrical connection points of the step surface 242 to electrically and mechanically connect the second substrate 30 to the first substrate 10. The second substrate 30 is received in the wide portion 24 therein, and the processing chip 40 and the passive elements 42 are received in the narrow portion 26 therein. In other embodiments, the bottom surface 12 of the first substrate 10 defines a cavity 23 having only a single portion to receive the second substrate 30, the processing chip 40, and the passive elements 42.

Figure 2:
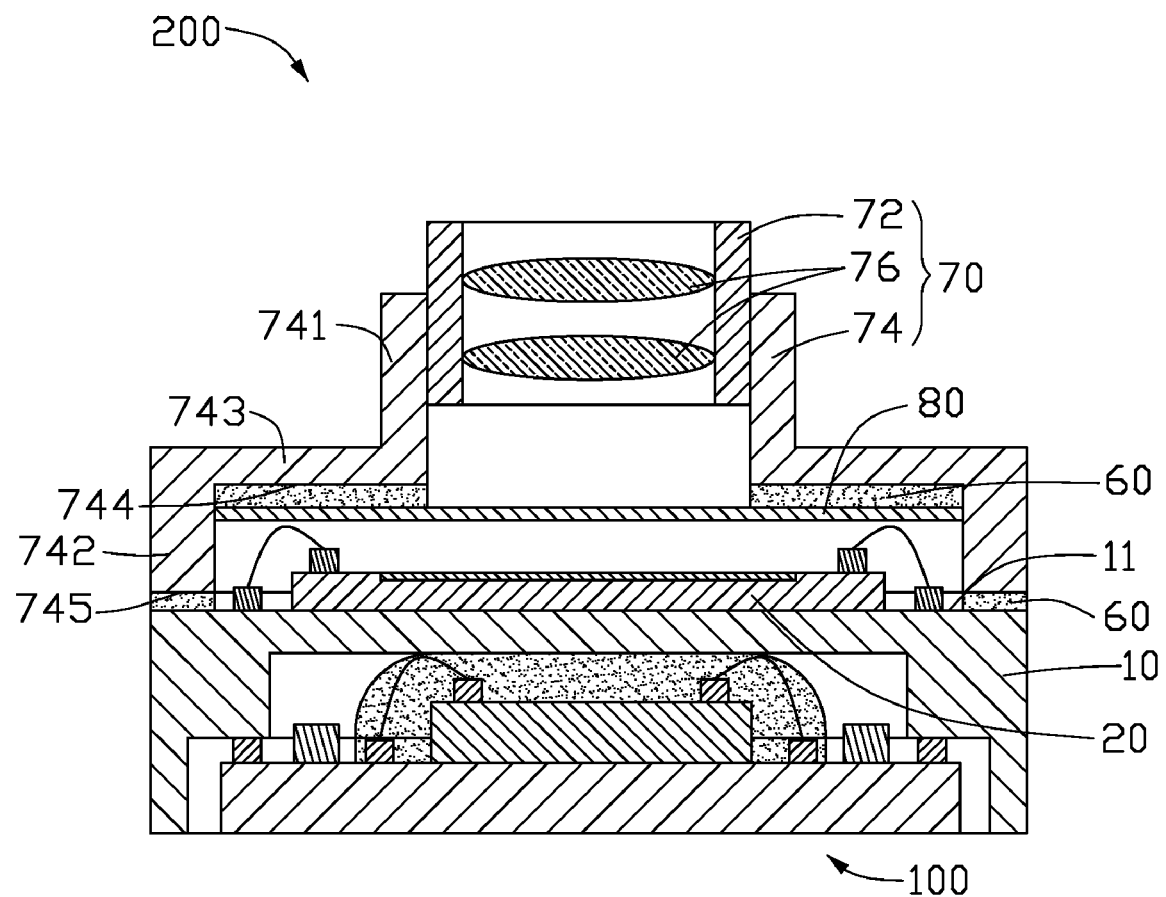
FIG. 2 is a schematic cross-sectional view of a camera module employing the image sensor package of FIG. 1.
Figure 3:
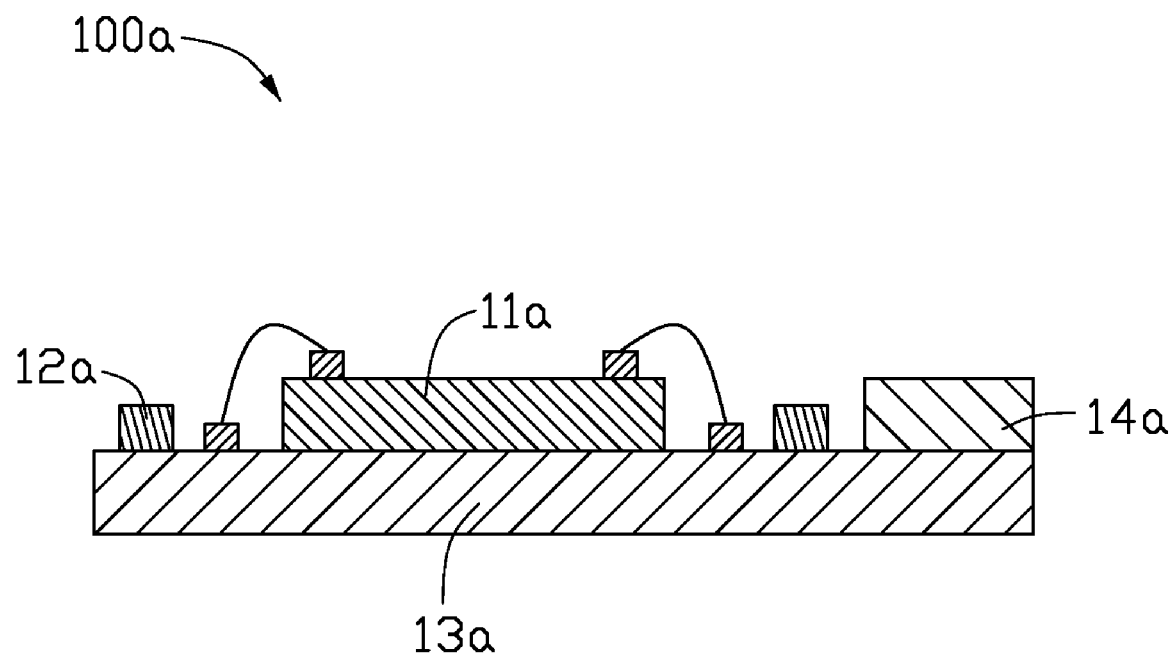
FIG. 3 is a schematic, cross-sectional view of a conventional image sensor package.

Referring to FIG. 2, a camera module 200 having the image sensor package 100 of the present embodiment is disclosed. The camera module 200 includes the image sensor package 100, a lens module 70, and glue 60.

The lens module 70 is aligned with the image sensor 20. The lens module 70 includes a lens barrel 72, a lens holder 74, and lens group 76. The lens holder 74 comprises a hollow top portion 741, a hollow bottom portion 742 coaxially aligned with the hollow top portion 741, and a connecting plate 743 connecting the top and bottom portions 741 and 742. The top portion 741 is smaller than the bottom portion 742. The lens group 76 is received in the lens barrel 72, and the combined lens barrel 72 and lens group 76 is received in the top portion 741 of the lens holder 74. The connecting plate 743 comprises a lower surface 744 facing the image sensor 20. The bottom portion 742 comprises a bottom surface 745. The bottom surface 745 of the lens holder 74 is adhered to the supporting surface 11 of the first substrate 10 by the glue 60. The glue 60 can be a silicone, epoxy, acrylic, or polyamide adhesive.

A translucent plate 80, such as an infrared filter, is provided between the image sensor chip 20 and the lens module 70 and is configured for protecting the photosensitive 21 from contamination and filtering light from the lens module 70. The translucent plate 80 is secured to the bottom surface 744 of the connecting plate 743 by the glue 60. Alternatively, the translucent plate 80 may be directly fixed to the lens module 70. The translucent plate 80 can be an optical glass plate.

It will be understood that the above particular embodiments and methods are shown and described by way of illustration only. The principles and the features of the present invention may be employed in various and numerous embodiments thereof without departing from the scope of the invention as claimed. The above-described embodiments illustrate the scope of the invention but do not restrict the scope of the invention.

What is claimed is:

1. An image sensor package comprising:
a first substrate having a supporting surface and a bottom surface opposite to the supporting surface, the first substrate defining a cavity at the bottom surface, the cavity being ladder-like and comprising a wide portion and a narrow portion communicating with the wide portion, a step surface being defined at a bottom of the wide portion with a plurality of electrical connection points defined thereon;
an image sensor chip disposed on the supporting surface and electrically connected to the first substrate;
a second substrate;
a processing chip disposed on and electrically connected to the second substrate; and
a plurality of passive elements disposed on and electrically connected to the second substrate;
wherein the second substrate, the processing chip and the passive elements are received in the cavity, the second substrate includes a top surface for supporting the processing chip, a plurality of soldering points disposed on the edge of the top surface of the second substrate, and wherein the soldering points are mechanically and electrically connected to the plurality of electrical connection points of the step surface to electrically and mechanically connect the second substrate to the first substrate.

2. The image sensor package as claimed in claim 1, wherein each of the plurality of soldering points is one selected from the group consisting of ball grid array (BGA), leadless chip carrier (LCC) and lead frame package type.

3. The image sensor package as claimed in claim 1, wherein the second substrate is received in the wide portion therein, and the processing chip and the plurality of passive elements are received in the narrow portion therein.

4. The image sensor package as claimed in claim 1, wherein the image sensor chip has a photosensitive area and a non-photosensitive area surrounding the photosensitive area, the non-photosensitive has a plurality of first chip pads formed thereon, a plurality of first base pads are disposed on the supporting surface and correspondingly connected with the first chip pads by a respective first wire.

5. The image sensor package as claimed in claim 4, wherein the processing chip has a plurality of second chip pads formed thereof, a plurality of second base pads are disposed on the second substrate, each second base pad is correspondingly connected with one of the plurality of second chip pads by a respective second wire.

6. The image sensor package as claimed in claim 5, wherein the image sensor package further including a encapsulation epoxy for enclosing the processing chip, the second chip pads, the second base pads and the second wires.

7. The image sensor package as claimed in claim 1, wherein the image sensor chip is mechanically and electrically connected with the first substrate by a package process.

8. The image sensor package as claimed in claim 1, wherein the processing chip is mechanically and electrically connected to the second substrate by a package process.

9. A camera module comprising:
an image sensor package comprising:
a first substrate having a supporting surface and a bottom surface opposite to the supporting surface, the first substrate defining a cavity at the bottom surface, the cavity being ladder-like and comprising a wide portion and a narrow portion communicating with the wide portion, a step surface being defined at a bottom of the wide portion with a plurality of electrical connection points defined thereon;
an image sensor chip disposed on the supporting surface and electrically connected to the first substrate;
a second substrate;
a processing chip disposed on and electrically connected to the second substrate; and
a plurality of passive elements disposed on and electrically connected to the second substrate;
wherein the second substrate, the processing chip and the passive elements are received in the cavity, the second substrate includes a top surface for supporting the processing chip, a plurality of soldering points disposed on the edge of the top surface of the second substrate, and wherein the soldering points are mechanically and electrically connected to the plurality of electrical connection points of the step surface to electrically and mechanically connect the second substrate to the first substrate; and a lens module, the lens module including a lens barrel, a lens holder and a lens group, the lens group being mounted inside the lens barrel and the lens barrel being installed in the lens holder, the image sensor package being installed inside the lens holder and adjacent to the lens barrel.

10. The camera module as claimed in claim 9, wherein the camera module further including a translucent plate arranged between the image sensor chip and the lens module.

11. The camera module as claimed in claim 9, wherein the soldering points are one selected from the group consisting of ball grid array (BGA), leadless chip carrier (LCC) and lead frame package type.

12. The camera module as claimed in claim 9, wherein the second substrate is received in the wide portion therein, and the processing chip and the plurality of passive elements are received in the narrow portion therein.

13. The camera module as claimed in claim 9, wherein the image sensor chip has a photosensitive area and a non-photosensitive area surrounding the photosensitive area, the non-photosensitive has a plurality of first chip pads formed thereon, a plurality of first base pads are disposed on the supporting surface and correspondingly connected with the first chip pads by a respective first wire.

14. The camera module as claimed in claim 13, wherein the processing chip has a plurality of second chip pads formed therein, a plurality of second base pads are disposed on the second substrate, each second base pad is correspondingly connected with one of the plurality of second chip pads by a respective second wire.

15. The camera module as claimed in claim 14, wherein the image sensor package further including a encapsulation epoxy for enclosing the processing chip, the second chip pads, the second base pads and the second wires.

16. The camera module as claimed in claim 9, wherein the image sensor chip is mechanically and electrically connected with the first substrate by a package process.

17. The camera module as claimed in claim 9, wherein the processing chip is mechanically and electrically connected to the second substrate by a package process.

* * * * *